United States Patent
von Bergmann et al.

(10) Patent No.: US 6,198,761 B1
(45) Date of Patent: Mar. 6, 2001

(54) COAXIAL LASER PULSER WITH SOLID DIELECTRICS

(75) Inventors: Hubertus von Bergmann, Irene (ZA); Spencer Merz, Brookline, MA (US)

(73) Assignee: Lambda Physik GmbH, Gottingen (DE)

(*) Notice: Subject to any disclaimer, the term of this patent is extended or adjusted under 35 U.S.C. 154(b) by 0 days.

(21) Appl. No.: 09/390,146

(22) Filed: Sep. 3, 1999

Related U.S. Application Data
(60) Provisional application No. 60/133,083, filed on May 7, 1999.

(51) Int. Cl.[7] .................................. H01S 3/097
(52) U.S. Cl. .................. 372/86; 372/81; 372/82; 372/25
(58) Field of Search .................. 372/81, 86, 82, 372/25; 307/419

(56) References Cited

U.S. PATENT DOCUMENTS

| | | | |
|---|---|---|---|
| 4,718,072 | 1/1988 | Marchetti et al. | 372/86 |
| 4,763,093 | 8/1988 | Cirkel et al. | 336/58 |
| 4,928,020 | 5/1990 | Birx et al. | 307/106 |
| 4,983,859 | 1/1991 | Nakajima et al. | 307/419 |
| 5,090,021 | * 2/1992 | Nakatani et al. | 372/86 |
| 5,142,166 | * 8/1992 | Birx | 307/419 |
| 5,177,754 | 1/1993 | Ball et al. | 372/38 |
| 5,181,217 | 1/1993 | Sato et al. | 372/38 |
| 5,305,338 | 4/1994 | Wakata et al. | 372/38 |
| 5,313,481 | 5/1994 | Cook et al. | 372/37 |
| 5,315,611 | 5/1994 | Ball et al. | 372/56 |
| 5,319,665 | 6/1994 | Birx | 372/69 |
| 5,729,562 | 3/1998 | Birx et al. | 372/38 |
| 5,754,579 | 5/1998 | Mizoguchi et al. | 372/58 |
| 5,914,974 | 6/1999 | Partlo et al. | 372/38 |

FOREIGN PATENT DOCUMENTS

| | | |
|---|---|---|
| 38 42 492 | 12/1988 | (DE) . |
| 2267790 | 6/1993 | (GB) ................ H03K/3/57 |
| WO 96/25778 | 8/1996 | (WO) . |

OTHER PUBLICATIONS

I. Smilanski et al., Electrical excitation of an XeCl laser using magnetic pulse compression, *Appl. Phys. Lett.*, vol. 40, No. 7, Apr. 1, 1982, pp. 547–548.

O. Kobayashi et al., "High power repetitive excimer lasers pumped by an all solid state magnetic exciter," SPIE vol. 622, *High Power and Solid State Lasers*, 1986, pp. 111–117.

A.L. Keet et al., "High voltage solid–state pulser for high repetition–rate gas lasers," *EPE Aachen*, 1989, 4 pages in length.

H.M. Von Bergmann, "Thyristor–driven pulsers for multi-kilowatt average power lasers," *IEE Proceedings–B*, vol. 139, No. 2, 1992, pp. 123–130.

Questek, "Magnetic pulse compression for excimer lasers," *Technical Note No. 2*, May 1983, 3 pages in length.

T. Shimada et al., "An all solid–state megnetic switching exciter for pumping excimer lasers," *Rev. of Sci. Instrum.*, vol. 56, No. 11, 1985, 3 pages in length.

(List continued on next page.)

*Primary Examiner*—Leon Scott, Jr.
(74) *Attorney, Agent, or Firm*—Limbach & Limbach L.L.P.

(57) ABSTRACT

A pulser with solid dielectrics including a pulse compressor and pulse transformer apparatus, which is able to produce short bursts of electrical energy at high voltage utilizing a coaxial structure. Both the transformer and the compressor utilize ferromagnetic cores having an inner and an outer diameter, and isolating members of similar geometry. The cores and ceramic members are held in place using conducting plates and bus bars. The overall structure of the compressor and the transformer is built around a central axis.

37 Claims, 16 Drawing Sheets

OTHER PUBLICATIONS

T. Shimada et al., "Semiconductor switched magnetic modulator for rep–rate lasers," *IEEE Pulse Conference*, Crystal City, Virginia, Jun. 10–12 1985, 4 pages in length.

H.J. Baker et al., "An efficient laser pulser using ferrite magnetic switches," published by IOP Publishing Ltd., 1988, pp. 218–224.

W.M. Flanagan, *Handbook of Transformer Design and Applications*, 2nd Edition, copyright 1993, 1986 by McGraw Hill, pp. 10.1–10.29.

F.W. Grover, *Inductance Calculations*, Chapter 5, entitled: "Parallel Elements of Equal Length," New York, 1945, pp. 31–44, 1946.

W.S. Melville, "The Use of Saturable Reactors as Discharge Devices for Pulse Generators," *The Proceedings of the Institution of Electrical Engineers*, Part III Radio and Communication Engineering, London, England, vol. 98, 1951, p. 185.

D.L. Birx et al., "Regulation and Drive System for High Rep–Rate Magnetic Pulse Compressors", Proceedings 15th Power Modulator Symposium in Baltimore, Maryland, Jun. 14–16 1992, pp. 15–21.

D. Basting et al.,"Thyratrons with Magnetic Switches: The Key to Reliable Excimer Lasers", *Laser und Optoelektronik*, No. 2, 1984, pp. 128–131.

H.J. Baker et al., "Magnetic switching circuits for variable high voltage pulse delays and gas–laser synchronisation", *J. Phys. E:Sci. Instrum*, No. 19, 1986, pp. 149–152.

I. Druckman et al., "A New Algorithm for the Design of Magnetic Pulse Compressors," IEEE Single Copy Sales, *1992 Twentieth Power Modulator Symposium*, 1992, pp. 213–216, 1992.

M. Greenwood et al., "An Optimisation Strategy for Efficient Pulse Compression," *IEEE Conference Record of the 1990 Nineteenth Power Modulator Symposium*, 1990, pp. 187–191, 1990.

* cited by examiner

SAME PATTERN BOTH SIDES FOR
AUTOTRANSFORMER CONNECTION

B-H CHARACTERISTIC CURVE

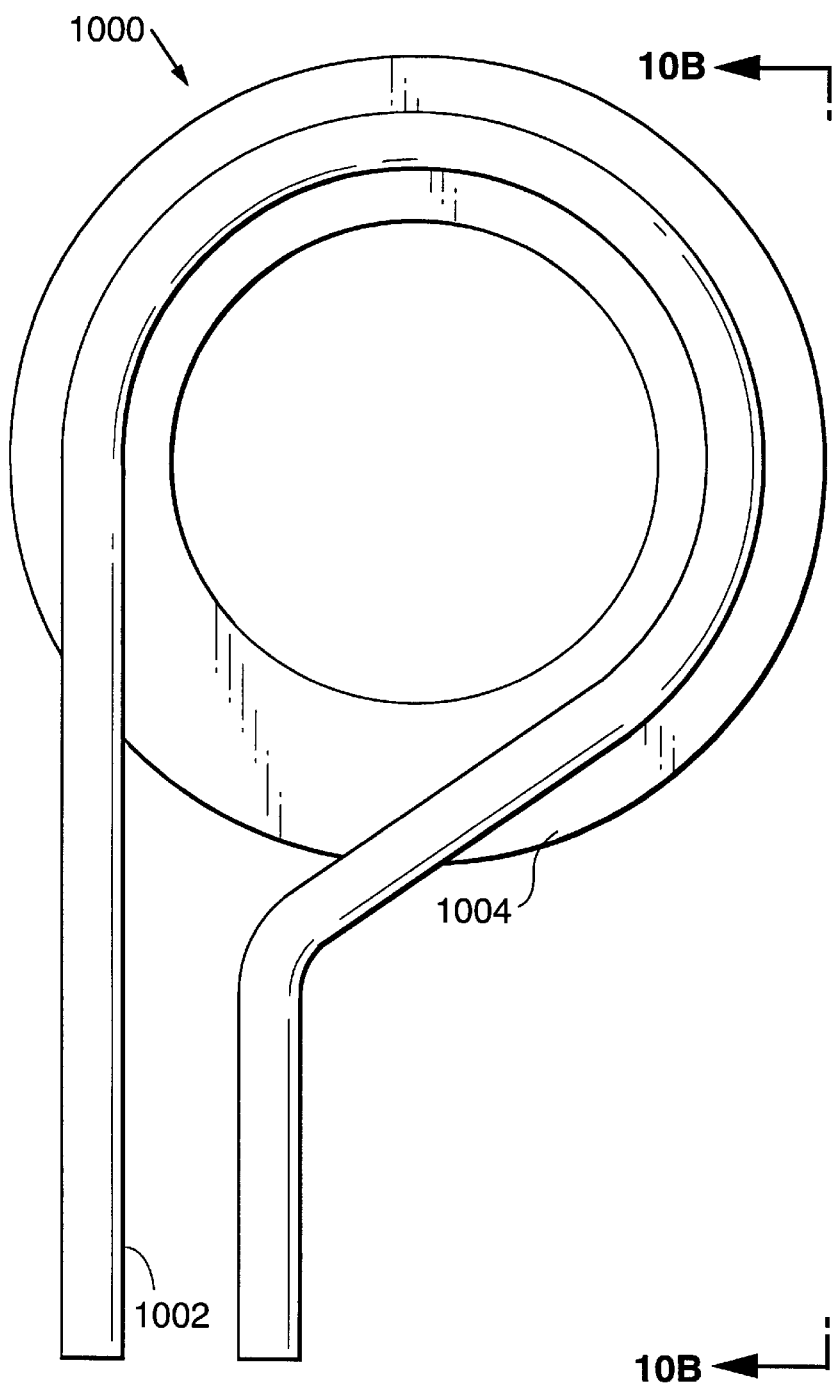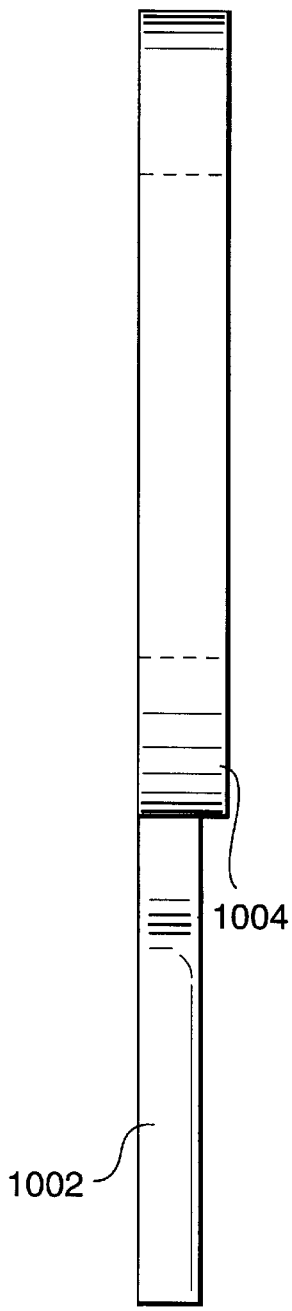
FIG. 10A
FIG. 10B

SOLID IS TOP BOARD. DOTTED IS BOTTOM BOARD.
PATTERN SAME FOR BOTH. SAME O.D. AS SINGLE TURN.

COAXIAL LASER PULSER WITH SOLID DIELECTRICS

PRIORITY

The priority date for this invention is based on the provisional filing entitled AN IMPROVED LASER PULSER which was filed on May 7, 1999, and has Application No. 60/133,083.

FIELD OF THE INVENTION

The invention relates to a coaxial laser pulser which utilizes solid dielectric compounds and provides pulses of electrical energy.

DESCRIPTION OF RELATED ART

The lithographic process employed in fabrication of microprocessor chips often employs an excimer laser as a short wavelength source of illumination. Specific types of excimer lasers include KrF, emitting at 248 nm, ArF, emitting at 193 nm, and $F_2$, radiating at 157 nm. Such a laser is direct discharge pumped, normally at voltages in the range of 30 kV, and at pulse repetition rates above 1 KHz. Peak electrical power input to the laser can be several tens of megawatts. Furthermore, to make the lithographic process commercially viable the equipment must not exhibit unscheduled down time and must deliver pulses of the highest stability, uniformity, and spectral quality for uninterrupted periods of weeks at a time.

These requirements have in recent time led to the development of pulsers driven by solid state switches as an improvement on switch life. Replacement of the gaseous thyratron with a solid state switch has been proven to greatly extend laser service intervals and hence reduce operating costs, but whereas the thyratron operating range covers voltages of 20–30 kV, best utilization of solid state switch capabilities occurs at lower voltages, typically in the range of 1–5 kV. Connecting solid state devices in series to reach the thyratron operating voltage range is not cost effective, and in addition solid state switches of the type utilized do not possess sufficient di/dt capability to provide the required voltage risetime of 50–100 ns. Hence the solid state switch is normally used to drive a step-up pulse transformer and a multi-stage pulse compressor to reach correct laser operating voltage and voltage risetime. The attainment of the necessary voltage level, in the range of 30 kV, with sufficiently low circuit inductance, in the range of tens of nH or less, at multikilowatt average power levels is typically done with transformer oil, vapor phase coolants, or pressurized gas such as sulfur hexafluoride or nitrogen. Examples of some pulsers are seen in U.S. Pat. Nos. 5,142,166 and 5,313,481 and 5,177,754.

Atmospheric air does not possess sufficient dielectric strength to withstand the necessary voltage stress or the necessary thermal properties to dissipate the generated heat. Leak-free containment of oil over long time periods is known to be difficult. Vapor phase coolants are expensive and primarily suited for heat removal rather than voltage insulation. Gas containment at the necessary several atmospheres pressure requires use of thick-walled pressure vessels and elaborate seals. In addition, for the above approaches a heat exchanger and pump are required to extract heat from the cooling medium. Using solid dielectrics such as thermal compounds in paste form in present pulser designs is cost prohibitive and would generate excessive temperature gradients due to their basic thermal properties.

The low voltage portion of such a pulser operates at high effective currents which require cooling and the high voltage portion requires positive air displacement to prevent corona generation and resulting breakdown. These requirements exist due to the high voltages, currents, and rates of change of these voltages and currents and the dimensional constraints imposed by the geometry of the laser system. The laser electrode system is typically driven from a point which is centrally located on the chamber so as to present the lowest possible inductance to the energy transfer system. What is needed is a pulser which generates the voltage necessary to drive a laser, but which does not require liquid or gaseous dielectric compounds and exhibits radial symmetry thereby providing law-transfer impedance.

A great deal of work has been done in the area of designing pulse compressors, transformers and the like. One example of a reference dealing with leakage inductance and flux considerations of transformers is Flanagan, William M. *Handbook of Transformer Applications*, Second Ed., New York: McGraw Hill, 1993. An example of a work providing detailed background on inductance calculations is Grover, Frederick W. *Inductance Calculations* New York: D. van Nostrand Company, Inc., 1946. A seminal work relating to pulse compressor theory and circuit description is Melville, W. S., "The Use of Saturable Reactors as Discharge Devices for Pulse Generators", Proceedings of the Institution of Electrical Engineers, Radio and Communications, London, England, Vol 93, p185, 1951. Another work relating to pulse compressor theory is von Bergmann, H. M., Swart, P. H., "Thyristor-Driven Pulsers for Multikilowatt Average Power Lasers", IEE Proceedings -B, Vol 139, No. 2, March 1992. A work providing background on compressor stage optimization is Greenwood, M. and Gowar, J., "An Optimization Strategy for Efficient Pulse Compression", University of Bristol, Industrial Electronics Group, Queen's Building, University Walk, Bristol BS8 1TR, United Kingdom, IEEE publication 1990. Another work providing background on compressor stage optimization is Druckman, I., Gabay, S., and Smilanski, I., "A New Algorithm for the Design of Magnetic Pulse Compressors", NRCN, P.O. Box 9001, 84190 Beer Sheva, Israel. Also published in 1992 by IEEE.

SUMMARY OF THE INVENTION

The invention eliminates the need for liquid and gaseous dielectric compounds in the pulser. An objective of one embodiment of this invention is to provide a pulser which obviates the need for liquid or gaseous dielectric compounds and thereby avoids leakage of a dielectric liquid or gas which can create a contaminated environment which is highly detrimental to the lithographic process. In the preferred embodiment this is achieved using a coaxial pulse compressor and pulse transformer in conjunction with a conformal solid dielectric material as disclosed herein and the equivalents thereof as disclosed herein. Numerous other advantages can be obtained by providing a pulser as described herein. First, leakage of a dielectric liquid or gas can cause failure or unscheduled shutdown of the lithographic equipment. Second, service or modular replacement of laser components as presently constructed requires several personnel and often power assisted lift or transport mechanisms due to the size and weight of such components. This invention eliminates several tens of liters of transformer oil and the attendant weight as well as the need for an oil tight tank. Third, elimination of circulating pumps and heat exchangers reduce the count of moving parts, shaft seals, gaskets, and galvanic contact of dissimilar metals and hence improves the reliability of the pulser. The present invention uses a solid dielectric compound and does not require dielectric liquids or gases and hence offers considerable size and weight reduction. A further advantage of an embodiment of the invention is that the space and special handling and storage requirements for replacement pulsers are reduced due to the considerable weight reduction.

BRIEF DESCRIPTION OF DRAWINGS

FIG. 10A is a plan view showing details of a chill plate for cooling.

FIG. 10B is a side view showing details of a chill plate.

DETAILED DESCRIPTION

Figure 1:
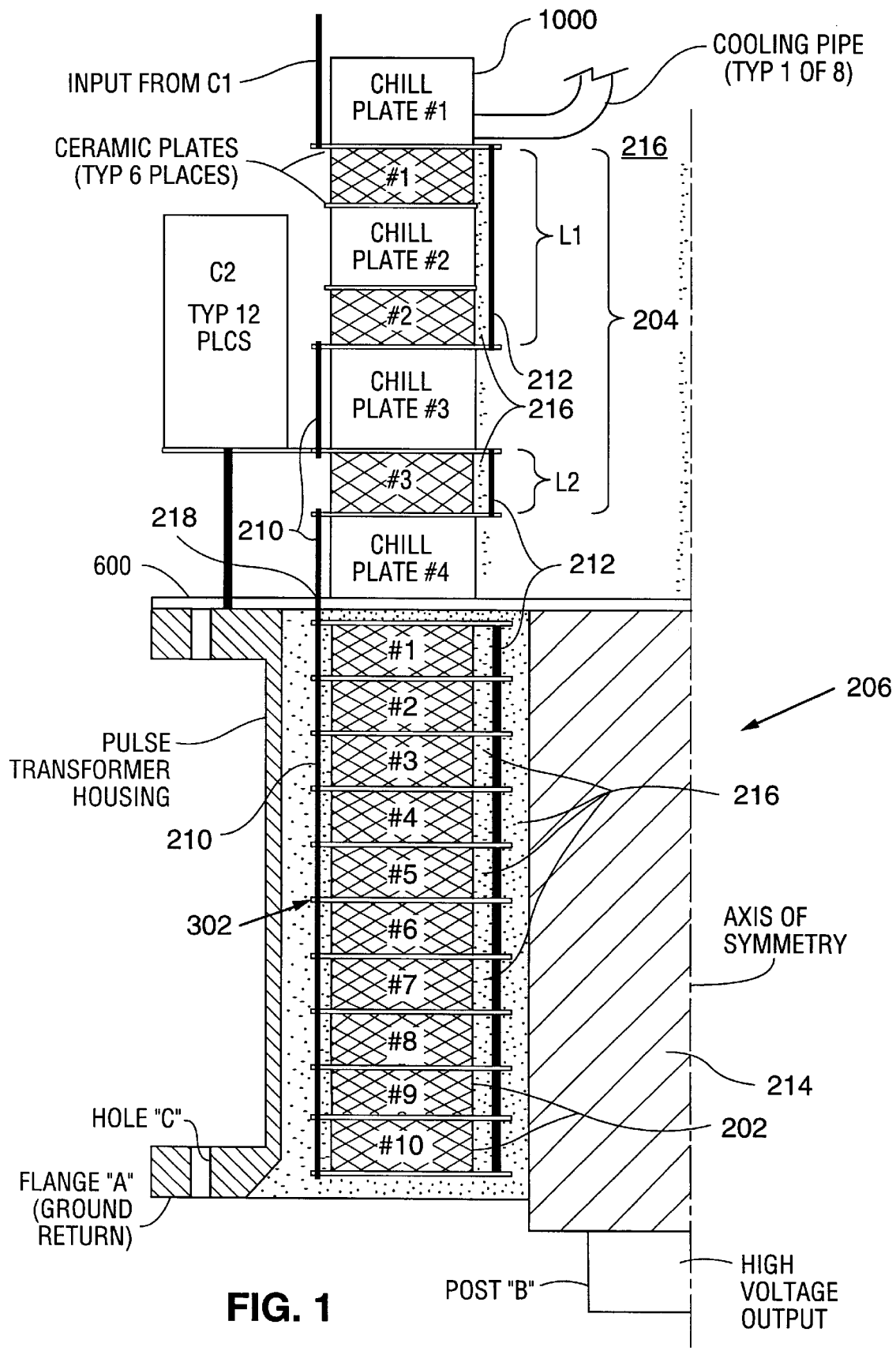
FIG. 1 is a cross-sectional view of a portion of a pulser assembly of an embodiment of the invention.
Figure 12:
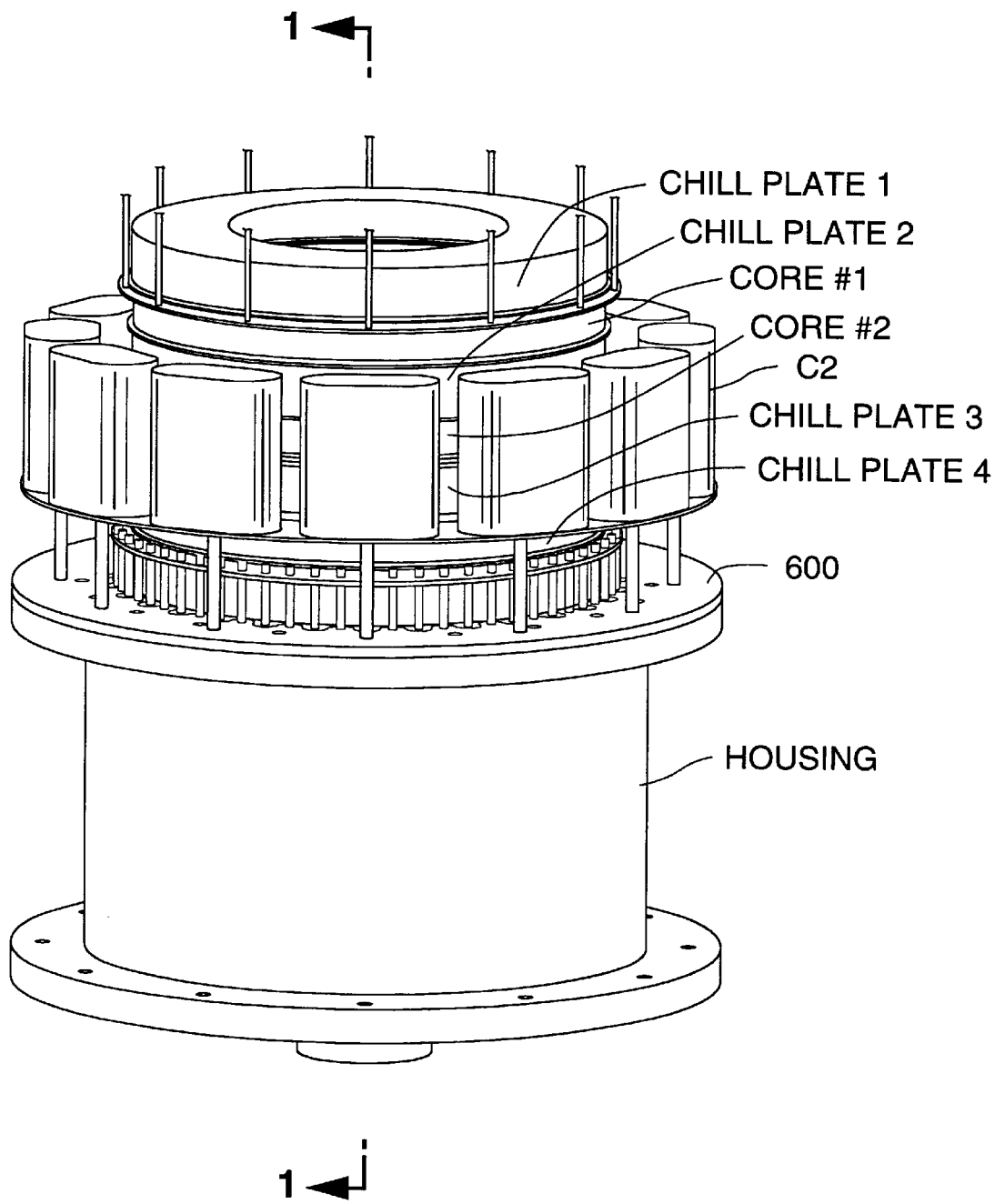
FIG. 12 is an isometric view of the pulser of the invention.
Figure 13A:
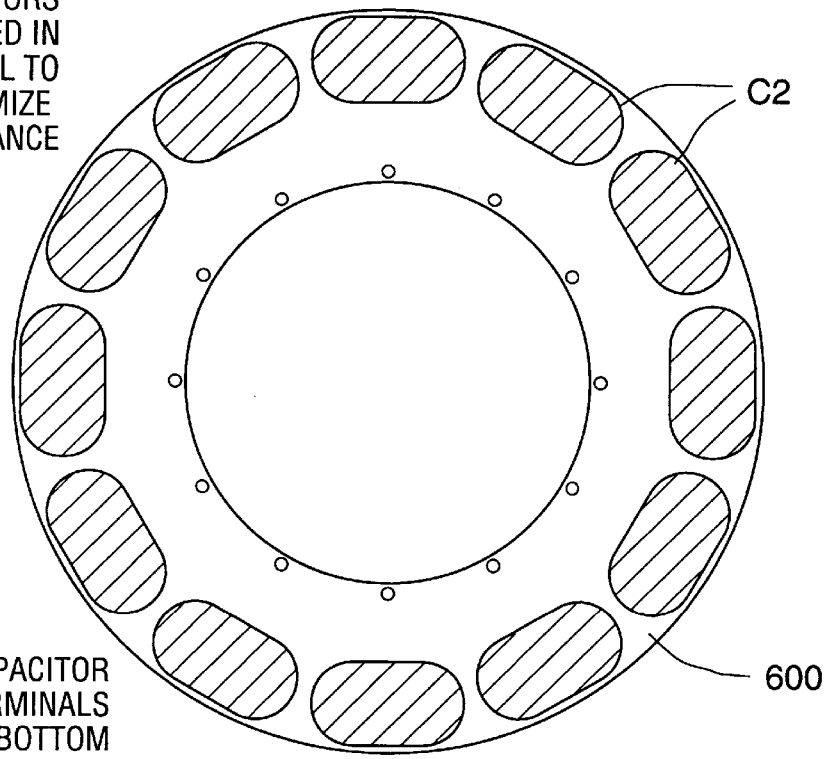
FIG. 13A is a top plan view of a cross section of the pulser of an embodiment of the invention having conventional capacitors.

FIG. 1 shows a cross-sectional view of one half of the left side of the pulser assembly of an embodiment of the invention. A simplified isometric view of an assembled pulser of an embodiment of the invention is shown in FIG. 12. FIGS. 13 and 14 show top and bottom plan views of the pulser. As shown the pulser assembly includes two primary functional components. One is the compressor portion of the pulser, which is shown in FIG. 1 as the 204. The other component is the transformer 206. A number of annular shaped ferromagnetic cores 202 are configured in the transformer. One skilled in the art will recognize that a wide range of amorphous metal materials could be used.

Figure 15:
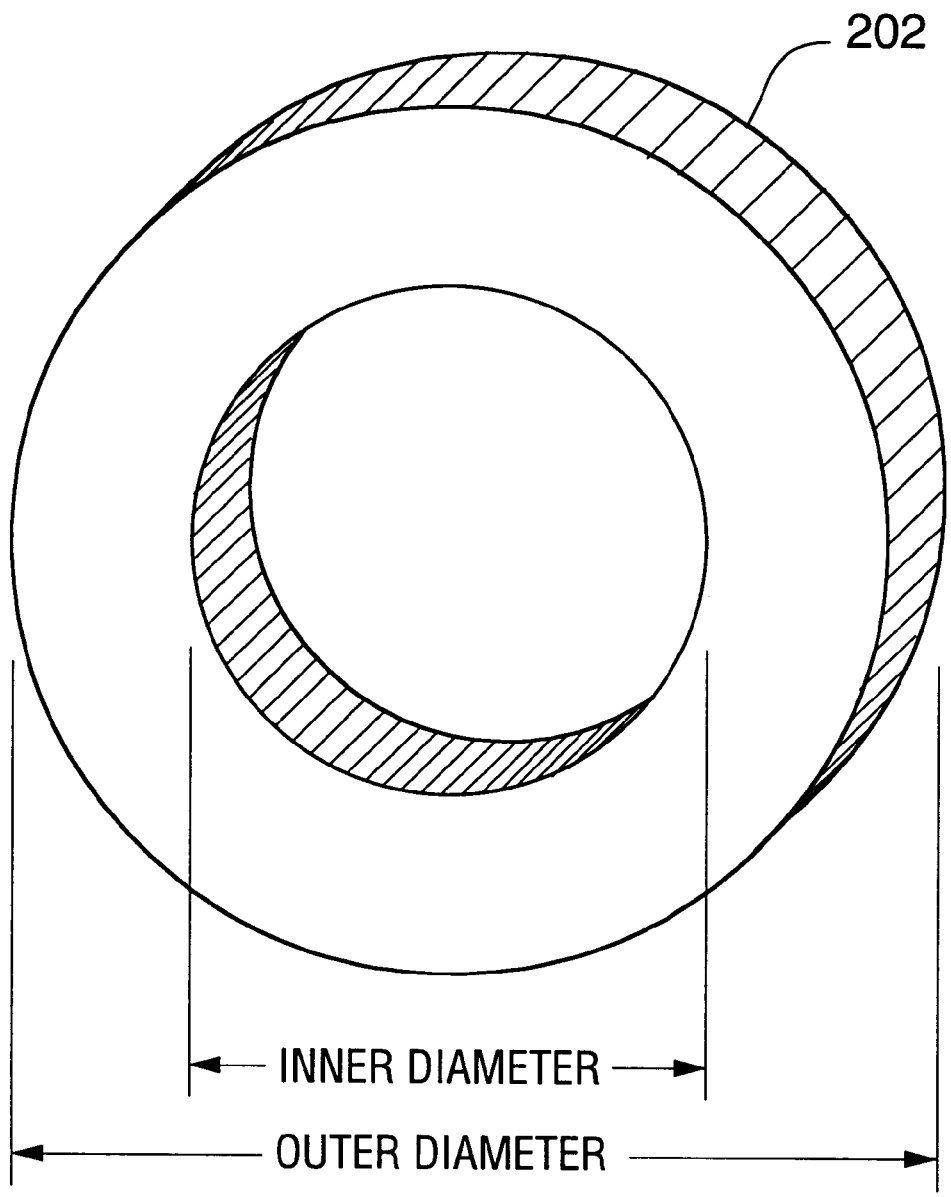
FIG. 15 is an isometric view of a core of the transformer.

These cores are shown as #1–#10 in FIG. 1. One skilled in the art would realize that the number of cores used could be changed. In the preferred embodiment, the cores are of Finemet nanocrystalline material manufactured by Hitachi Heavy Metals of Japan, measuring approximately 140 mm at the outer diameter and 85 mm at the inner diameter and 10 mm thick. One skilled in the art would recognize that a wide range of shapes could be used for the cores. The cores could be circular in shape or oval shaped or any other of a range of shapes which allow for the cores to be placed about a generally central axis. An isometric view of an embodiment of one of these cores is shown in FIG. 15.

Figure 2:
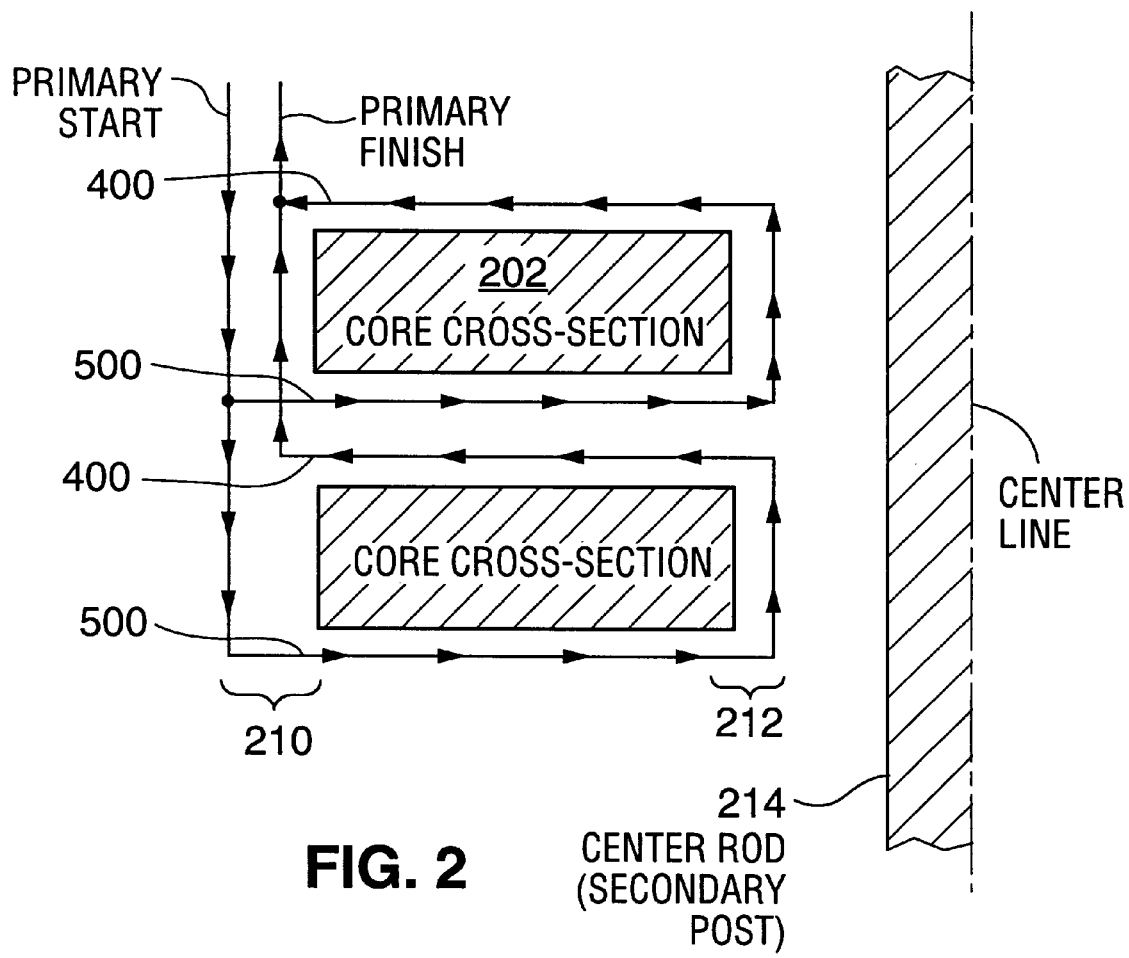
FIG. 2 is a diagram showing details of the electrical connection relative to pulse transformer cores.

FIG. 2 shows the electrical configuration of the pulse transformer relative to two ferromagnetic cores 202 of the transformer 206. As shown in FIG. 2, primary start and primary finish single turns enclose each core. In addition, a post passes through the center of each core. The post is the center rod 214 shown in FIG. 1. This center rod acts as the secondary, and thus the voltage across the center rod is equal to the voltage across a single turn times the number of cores. (For purposes of the discussion herein the system is assumed to be lossless.) This arrangement provides that the voltage developed across the center rod is equal to the voltage across the single turn primaries times the number of cores.

Figure 3:
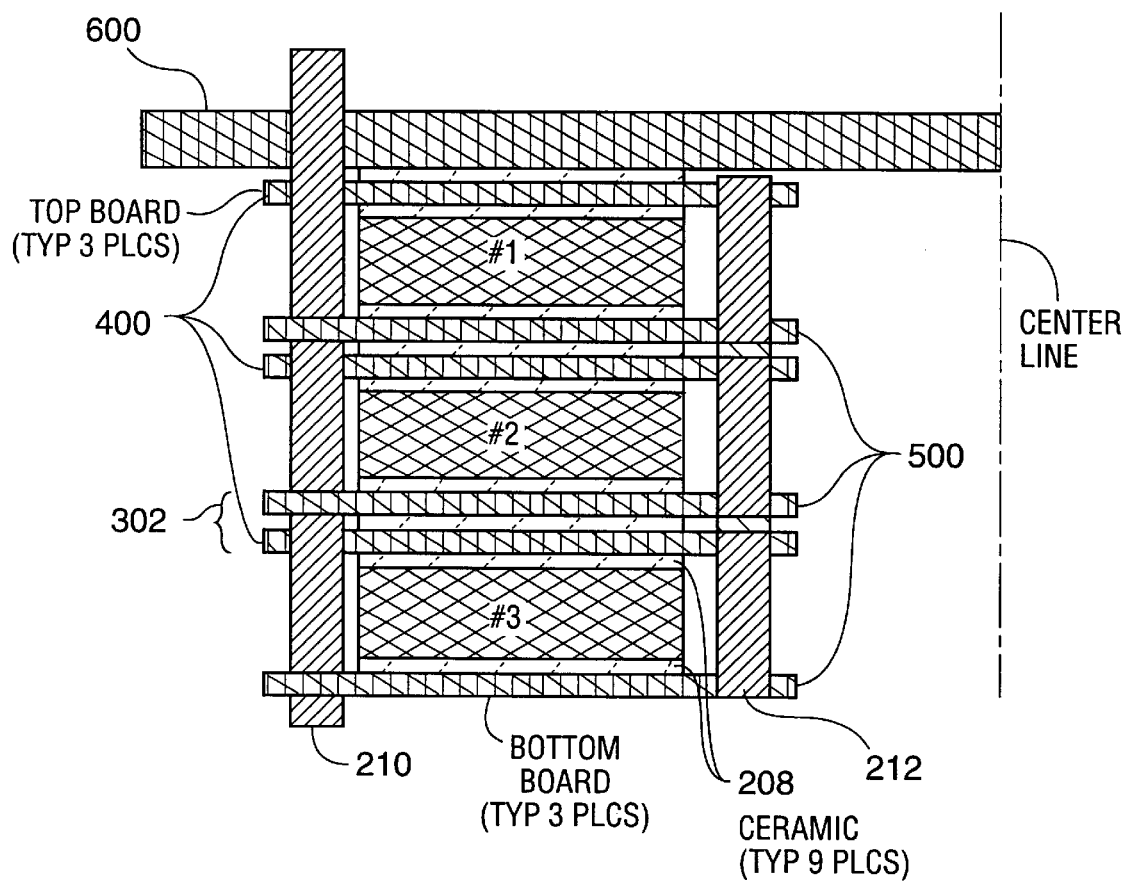
FIG. 3 is a diagram showing a pulse transformer core connection arrangement.

FIG. 3 shows a configuration of pulse transformer ferromagnetic cores. As shown in FIG. 3, there are three transformer cores, 202, but different numbers of cores could be used. For example, in FIG. 1, the transformer is shown having ten transformer cores. A ceramic plate 208 is positioned adjacent to the top and the bottom of each core. One skilled in the art will recognize that other materials, such as quartz or mica, which provide good thermal conductivity and galvanic isolation could be used instead of ceramic. In the preferred embodiment, the ceramic plates are high alumina ceramic plates, such as manufactured by Coors Ceramics Company of Colorado, measuring 1 mm thick which provide galvanic isolation and thermal conduction. A top 400 board having conducting plating is positioned adjacent to the top of the ceramic plate.

Another ceramic plate is positioned adjacent to the top board and a bottom board with conducting material 500 is then positioned adjacent to the ceramic plate. (A similar arrangement is also used in the compressor and transformer portions of the pulser embodiment shown in FIG. 1, but this level of the detail is not show in FIG. 1.) It should be recognized that the core material 202 could be formed of materials such that the outer surface of the core incorporates an isolating member which provides thermal conductivity and galvanic isolation and thereby alleviating the need for separate discrete isolating members as the isolation member is incorporated into the core.

Displacement of air is accomplished by use of a dielectric compound, such as HTC 61, manufactured by D6 Industries of Florida. A silicone loaded elastomer can also be used in conjunction with the dielectric compound if necessary. The dielectric compound 216 is distributed primarily in the opening at the center of the ceramic plate and the opening at the center of the core. The dielectric compound also exists between the cores, the ceramic plates and the conducting boards. Thus, the dielectric compound displaces air which might otherwise exist between these components. The dielectric compound provides galvanic isolation and thermal conductivity. During assembly of the pulser the dielectric compound, which is a putty type material, i.e. a material which is formable in shape sometimes referred to conformal, is applied to all components. After assembly of the pulser, the pulser is subjected to high vacuum conditions to exclude any air bubbles.

With the boards 400 and 500 (shown in FIGS. 2–5) aligned according to index marks as shown, all holes are connected by outer bus bars 210 and inner bus bars 212 and the outer row of bars 210 extend through the Cover Plate 600. Alternate bars connect bottom boards to a ground return section 602 of the cover plate 600 and intervening bars connect top boards to the inner section 604 of the cover plate 600. While the bus bars are shown as being generally cylindrical in shape one skilled in the art will understand that the bus bars could be a wide range of conducting materials formed in variety of shapes such as strips, ribbons or wires or other configurations. The important characteristic is that bus bars electrically couple the boards 400 and 500.

In the compressor stack portion of the circuit it is important that the bus bars are located at the inner and outer diameter of the boards such that they are proximate to the cores in order to minimize the saturated inductance and achieve the maximum compression per stage.

Reference to FIG. 2 in conjunction with FIG. 3 helps to illustrate the operation of the boards and the bus bars. The primary start and primary finish currents shown in FIG. 2 correspond to current carried on the outer bus bars 210 and the current which flows about the cores 202 adjacent to the center axis is carried on inner bus bars 212. The current which flows adjacent to the bottom of a core is carried on the conducting plating of the bottom boards 500. The current which flows adjacent to the top of a core is carried on the conducting plating of the top boards 400. Note that as shown, in the preferred embodiment, the width of the loops, i.e. the distance from the outer bus bar to the inner bus bar is the same for each of the loops. Thus, each of the loops has an equal width, and the bus bars are spaced at a minimum distance from the cores to achieve the minimum saturated inductance. Additionally, in order to minimize the saturated inductance all of the outer bus bars are spaced at the same outer distance from the center axis of the pulser and the inner bus bars are spaced at the same inner distance from the center axis of the pulser. In the preferred embodiment the bus bars are copper. In the preferred embodiment alternate outer bus bars connect all top boards 500 to the cover plate pattern 602 which is returned to ground via the pulse transformer housing, and the other set of alternating outer bus bars connect to the center rod 214 via the cover plate pattern 604.

Figure 4:
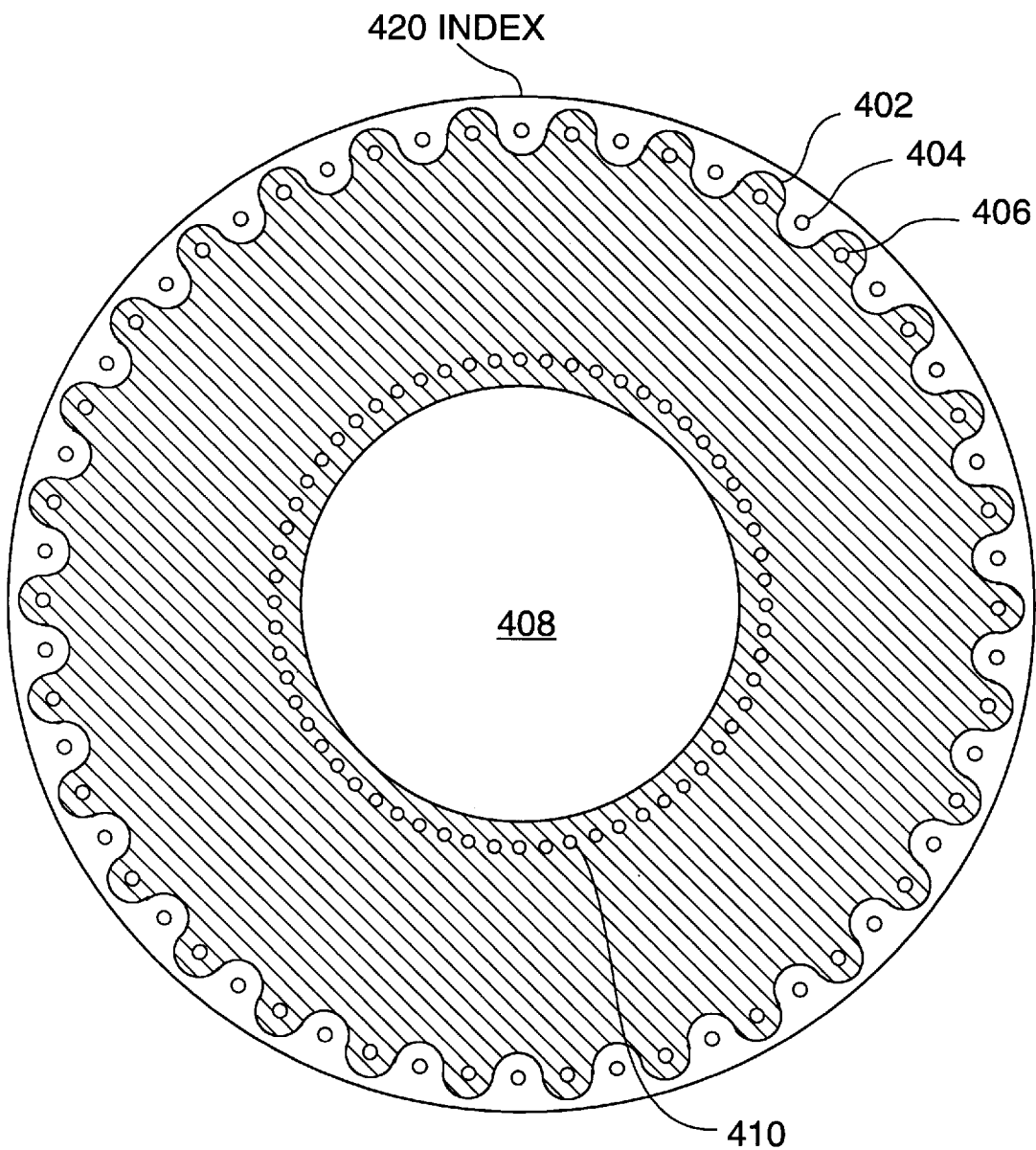
FIG. 4 is a diagram showing a top board of the pulse transformer.
Figure 5:
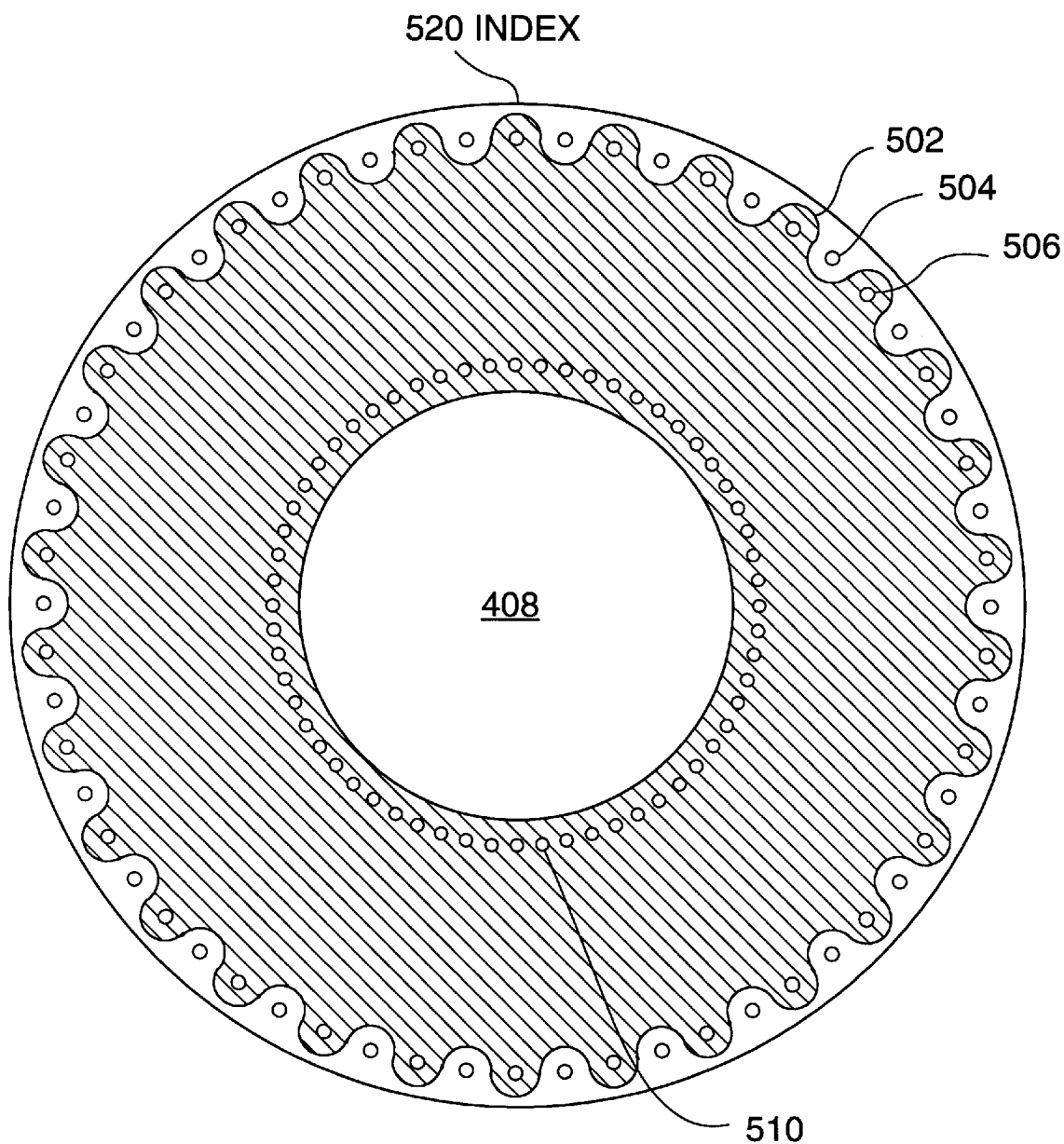
FIG. 5 is a diagram of a bottom board of the pulse transformer.

Plan views of the top printed circuit boards 400 are shown in FIG. 4. Plan views of the bottom printed circuit boards 500 are shown in FIG. 5. In the preferred embodiment the top and bottom boards are identical. In the assembled form the index points 420 and 520 are aligned so that the pattern of the curvature of the outer circumference of the plating patterns 402 and 502 is offset. In FIGS. 4 and 5 the dark patterned portions of the boards represent the portion of the board covered with a conducting material such as copper. The center open area 408 disposed within the inner diameter of the boards allows for insertion of the center rod 214 shown in FIG. 1. To obtain the best performance from the pulser it is desirable to make the outer diameter of the center rod as close as possible to the inner diameter of the top and bottom boards 400 and 500.

The via hole 406 of the top board is aligned with a hole 504 of adjacent bottom boards and with via holes 406 of other top boards of this assembly. In this manner an outer bus bar 210 can be inserted through the holes of the boards such that it electrically couples each of the top boards of the transformer. Similarly, outer bus bars are used to electrically couple each of the bottom boards by the via holes 506.

Figure 6:
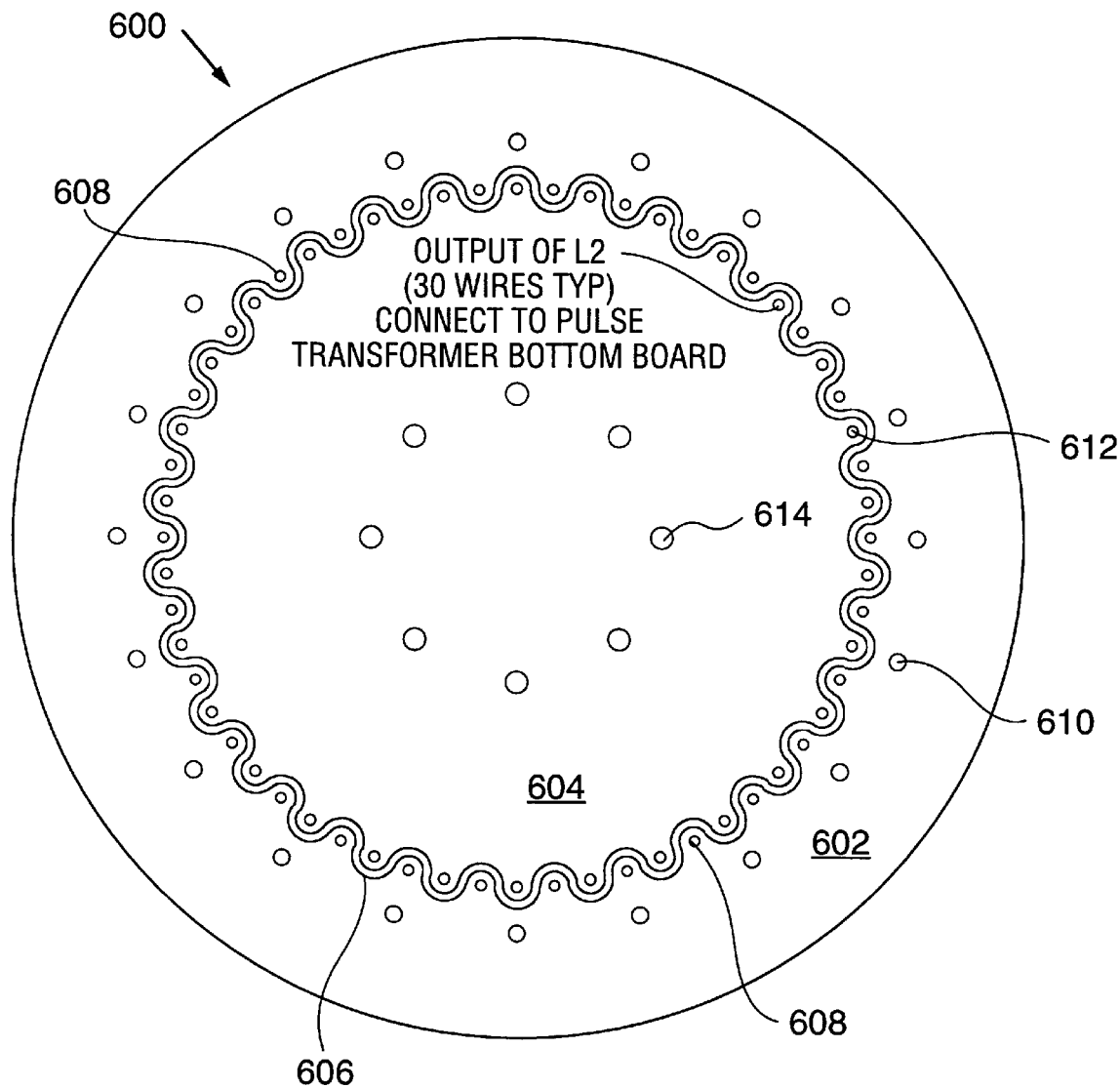
FIG. 6 is a diagram showing a cover plate of an embodiment of the invention.

The cover plate 600 is shown in FIG. 6. As shown the cover plate is configured for an autotransformer configuration. The area 602 is plated with a conducting material such as copper. The area 604 is also plated with a conducting material. The area 606 is an insulating area which isolates the conducting area 604 from the conducting area 602. The holes 608 provide a connection location for the bus bars 210 which are connected to the top boards 400 as discussed above. The holes 610 are used to secure the cover plate to the pulse transformer housing. The transformer housing provides the ground connection. The holes 612 connect to the bus bars 210 which are electrically coupled to the bottom boards as discussed above. The holes 614 are used to connect to the center rod.

Figure 7:
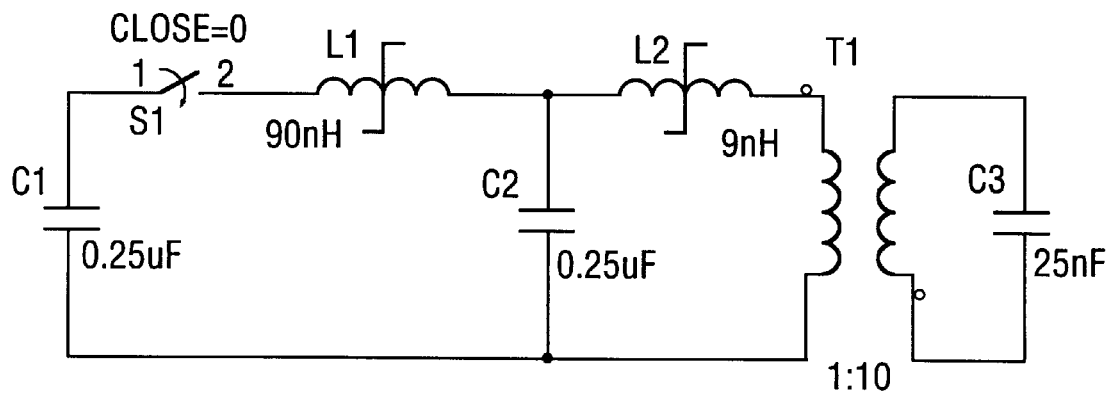
FIG. 7 is an electrical schematic showing a pulse compressor circuit with transformer coupling.
Figure 8:
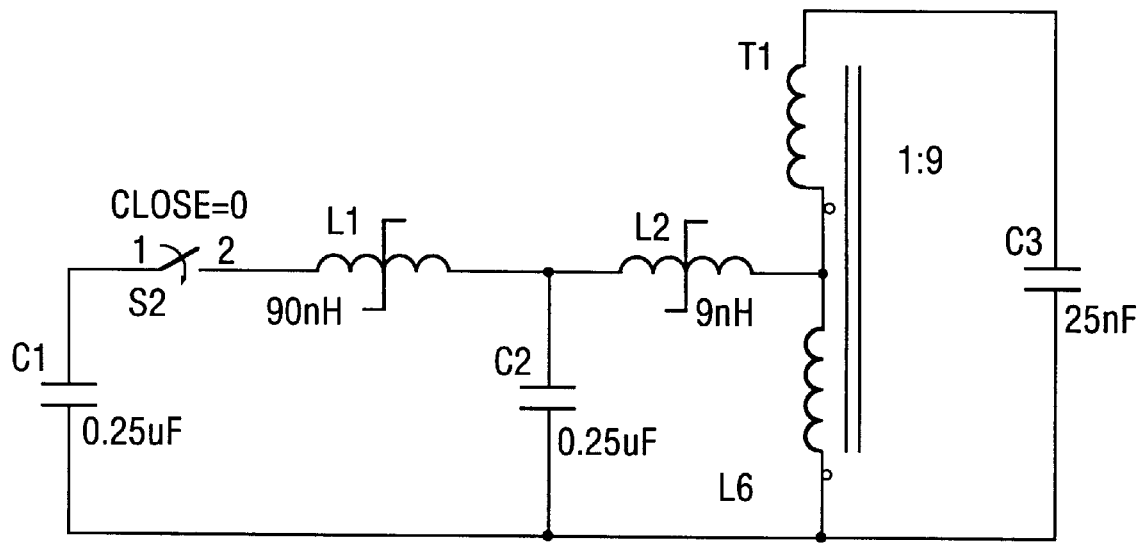
FIG. 8 is an electrical schematic showing a pulse compressor circuit with auto-transformer coupling.

While the autotransformer connection shown in terms of electrical components in FIG. 8 is described here, with minor changes in the copper etch pattern of the Cover Plate the conventional transformer connection may be employed as shown in terms of electrical components in FIG. 7. Since the autotransformer connection offers performance advantages as described elsewhere the conventional connection will not be described. The area 604 of the cover plate 600 is coupled to the output of the inductor L2.

Thus a number of cores 202, top and bottom conducting plates 400 and 500, and ceramic plates 208 are stacked in a completely coaxial manner. This provides for cores having one primary turn each being stacked on a central rod 214, across which is developed a voltage equal to the product of the primary turn voltage times the number of cores. This structure is shown in the cross-sectional view of one half of the pulser as seen in FIG. 1. This configuration permits transformation of a pulse train generated at a voltage level which does not require oil, freon, or pressurized gas insulation to the high voltage level necessary to properly couple energy to the laser chamber.

The pulse transformer housing is filled with the same dielectric compound used between cores, the top and bottom printed circuit boards, and ceramic plates as described above for purposes of insulation and heat transfer, and the heat thus conducted to the pulse transformer housing is carried off by means of fans or a water cooled chill plate connected at the flange.

Figure 9:
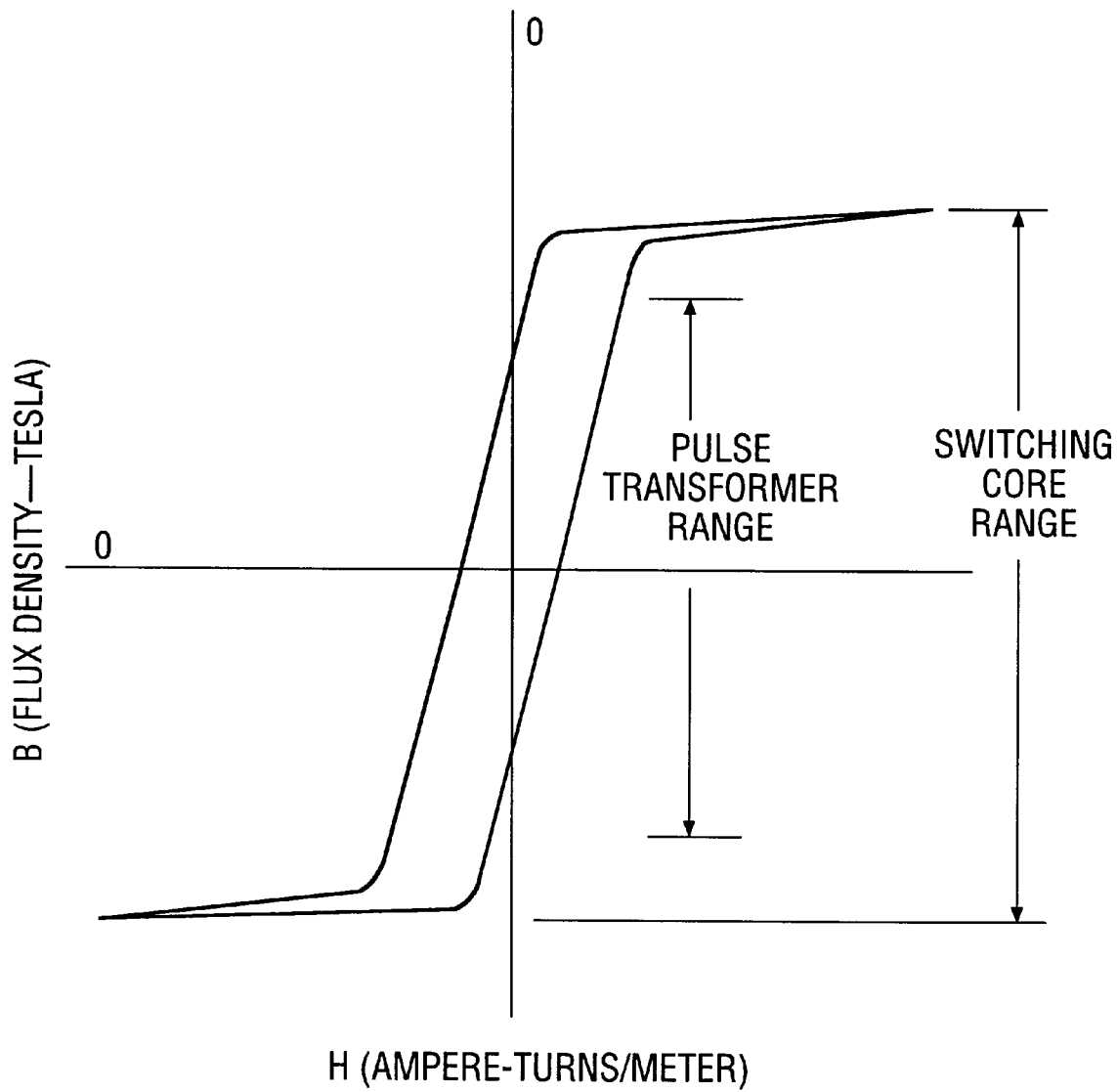
FIG. 9 shows the flex density, B, versus ampere-turns per meter, H, characteristics for a ferromagnetic core material.

Since the pulse transformer cores operate over the linear portion of their B-H characteristic curve as shown in the drawing "B-H Characteristic Curve" of FIG. 9 power losses will be small, and waste heat can be carried off by cooling the pulse transformer housing either with forced air or by means of a water cooled chill plate similar to those described below in connection with the compressor 204. The Flanagan reference referred to in the Description of Related Art section herein, provides a detailed description of B-H curves.

The compressor cores, however, (shown as Core #1, Core #2 and Core #3 in FIG. 1) are driven to hard saturation at the repetition rate of the laser, which may exceed 6 kHz. In the preferred embodiment the cores used in the compressor are made of a material similar to the cores 202 of the transformer. It has been found, however, that it is beneficial to use a slightly different material with a different B-H relationship, such that a very small change in ampere-turns, H, is all that is required to induce a large change of the magnetic flux density, B. A typical material used has iron losses which may reach 70 mJ per core, or 70 W per core per kHz, for a total of 1300 W at 6 kHz. These losses translate to heat generated by the compressor cores. For this reason each compressor core is thermally coupled on both faces by chill plates 1000 of aluminum which contain copper tubing through which flows water.

FIG. 10 shows that the copper tubing 1002 through which the chilled water flows is embedded in a metal plate 1004, which has a contour formed in it to receive the copper tubing. In one embodiment the metal used in the plate is aluminum but other materials could be used. The metal plate is formed such that it has approximately the same inner and outer diameter as the cores of the compressor. Chill plates are positioned above and below each core of the compressor to remove heat generated by the cores.

Use of ceramic plates 208 and solid dielectric compounds described above at the interface of printed circuit boards, ceramic plates and cores to displace trapped air at the component faces allows adequate cooling of these parts.

Windings at each stage of the pulse compressor 204 are configured in a manner similar to that described for the pulse transformer, but modified to provide the proper number of turns. In the embodiment shown in FIG. 1, the first stage, which corresponds to L1 as shown in FIG. 8, uses Core #1 and Core #2, and the second stage, which corresponds to L2, uses Core #3.

Figure 16:
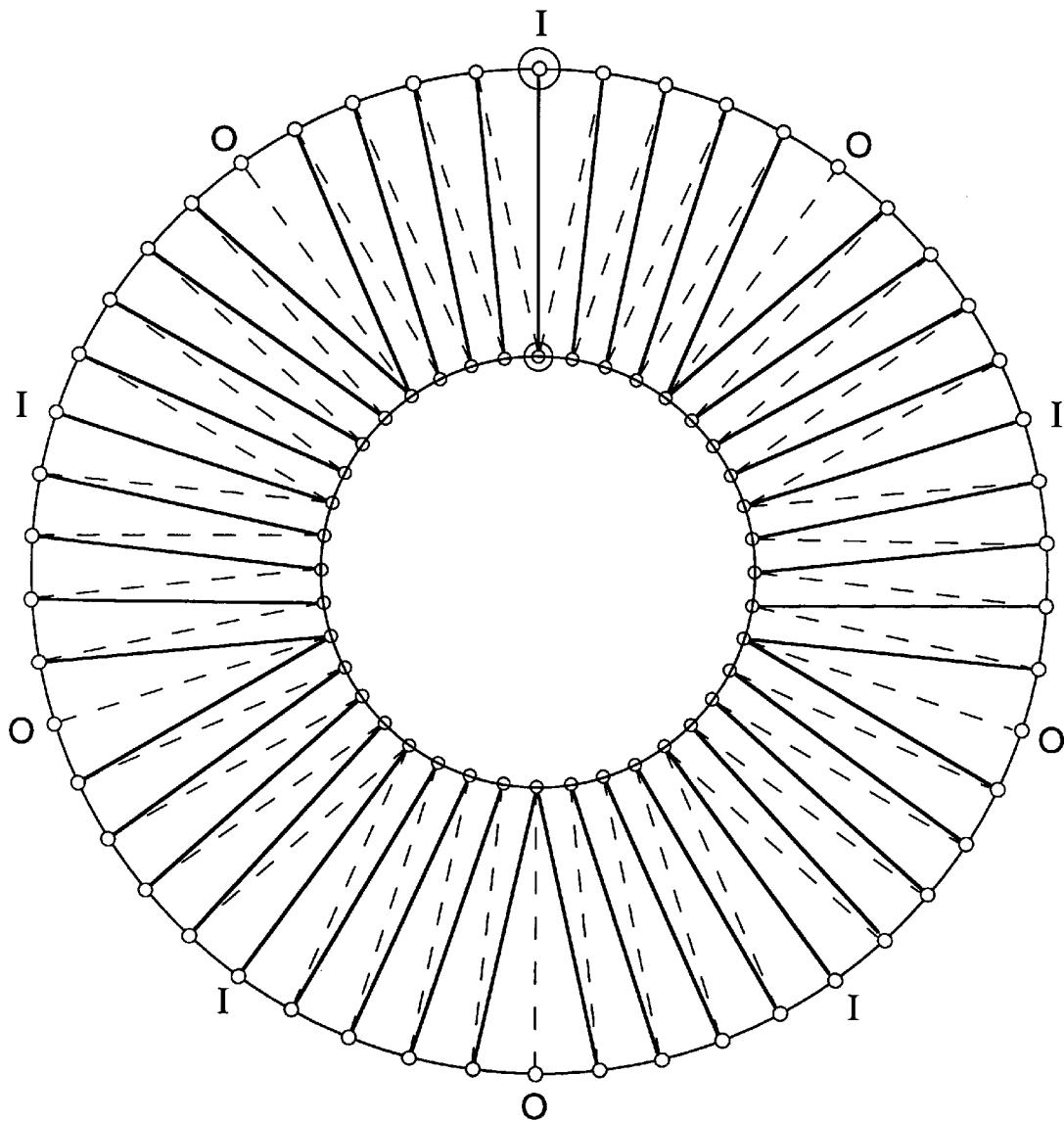
FIG. 16 shows the windings for the inductive portion of the compressor circuit.
Figure 17:
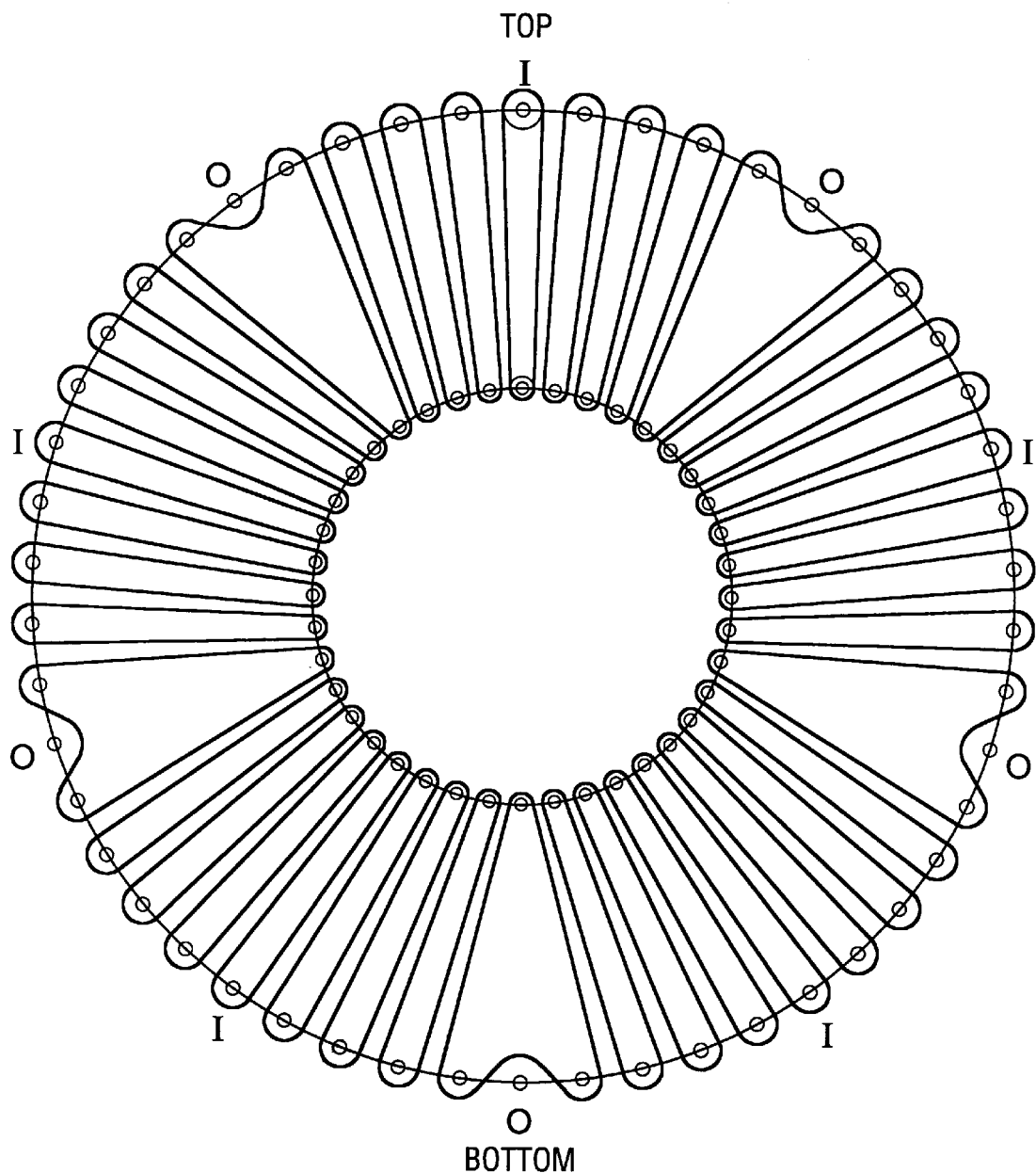
FIG. 17 shows the etch pattern for a top board and a bottom board of an embodiment of the compressor.

FIG. 16 shows a top plan view of the electrical windings around the cores of the compressor portion of the pulser assembly. In FIG. 16 the solid line is in the top board and the dashed line is in the bottom board. FIG. 17 shows the etch pattern of the conductive material on the surface of the pc board for one embodiment of the invention.

The interconnections between the compressor and the pulse transformer are made with the copper bars shown in FIG. 1, at point 218. These bars may number as many as 60 in practice in order to reduce leakage inductance to an absolute minimum and also carry the high effective current resulting from the great number of pulse transformer parallel primary windings. For similar reasons the capacitor shown as C2 consists of 12 capacitors distributed equally around the periphery of the compressor stack, which serves to divide the loop inductance of a single capacitor by 12. The top view of the pulser shown in FIG. 13A shows this.

Figure 11:
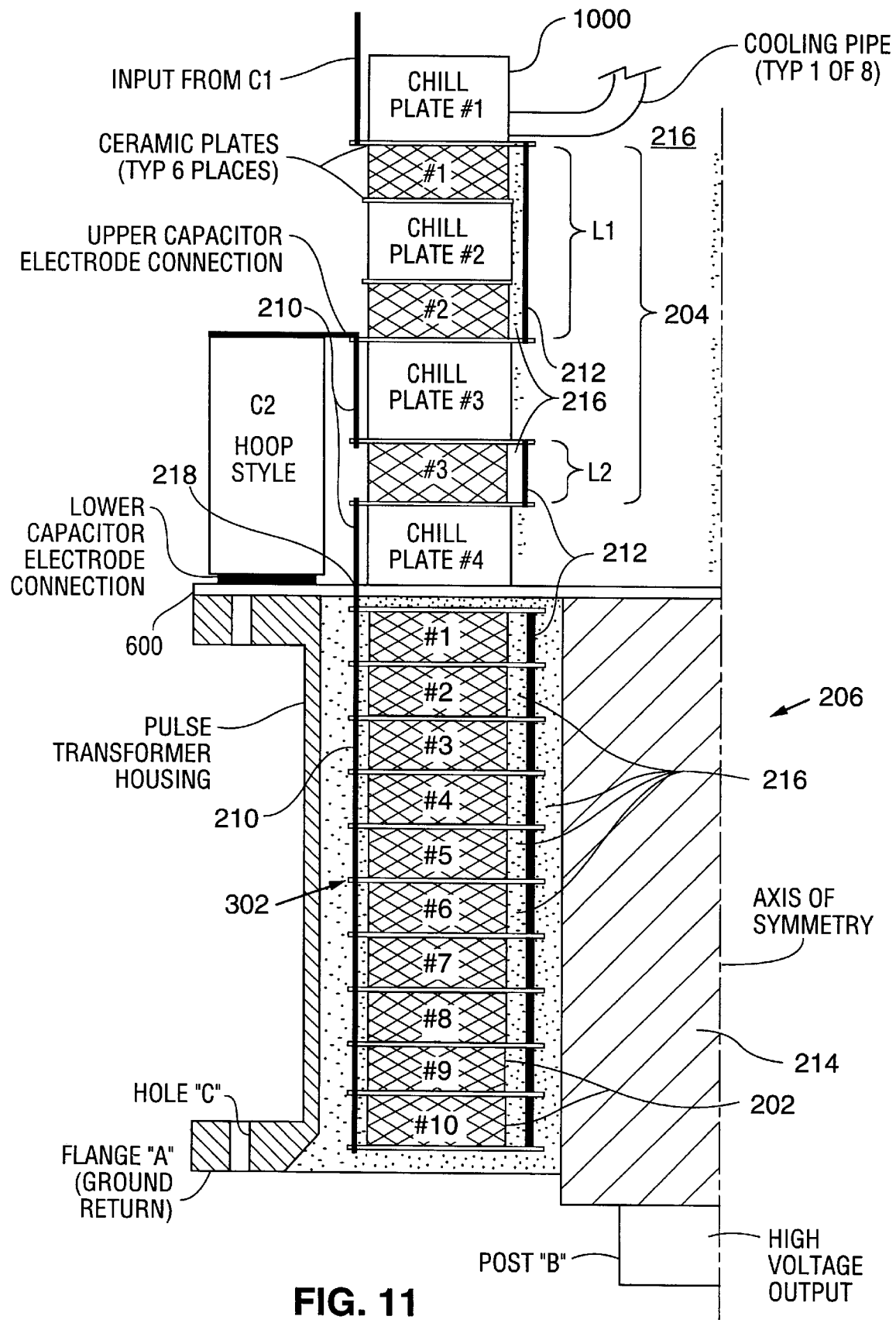
FIG. 11 is a cross-sectional view of a pulser assembly having a hoop-style capacitor.
Figure 13B:
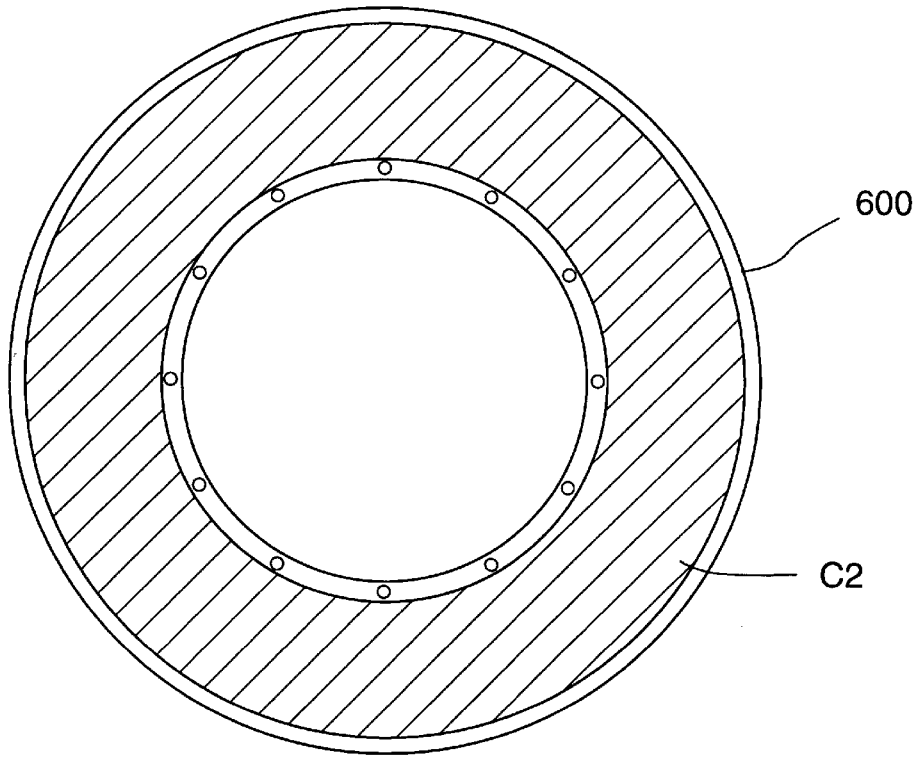
FIG. 13B is a top plan view of a cross section of the pulser of an embodiment of the invention having a hoop capacitor.
Figure 14:
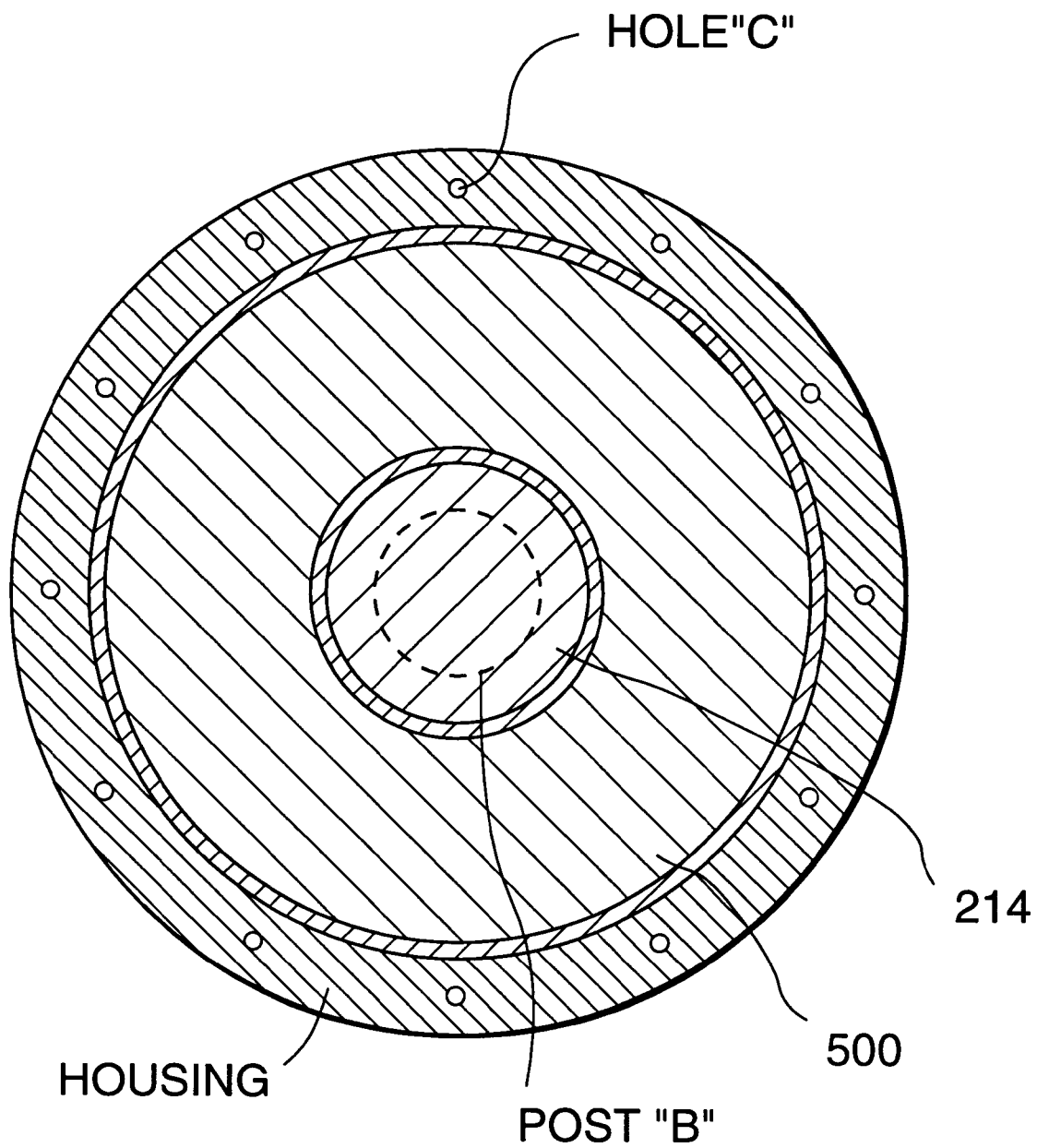
FIG. 14 is bottom plan view of the pulser of the invention.

FIG. 13B shows a modification of this concept, using a single capacitor C2 in the shape of a hoop with an inside diameter sufficient to enclose the compressor cores as shown in drawing Pulser Assembly Half Section Full Size (showing hoop capacitor) (FIG. 11). Here the 12 discrete capacitors are replaced by an effectively infinite number of capacitors serving to even more effectively reduce stray inductance.

Where loop inductance must be in the range of a few tens of nanohenries for proper circuit operation it is of prime importance to minimize external circuit inductance. The hoop capacitor can be made with termination rings bonded to the extended foil at top and bottom for extremely low inductance connections directly to the printed circuit boards which form the output winding of L2 and the connection to the primary of the pulse transformer. An additional advantage of this type of capacitor construction is that the heat generated within the capacitor by the effective current, which may be in the range of 250 A, is carried out through the low thermal impedance path provided by the rings to the external circuitry where cooling is available.

An advantage of this design is that flange "A" of the pulse transformer housing, Holes "C" in the housing flange, and Post "B", shown in FIG. 1, at the HV output match the present laser design, permitting interchangeability with existing pulsers.

Operation of the compression stages preceding the pulse transformer at a voltage level consistent with air insulation require extremely low values of stray inductance in the circuit layout in the stage adjacent to the transformer primary as well as in the transformer itself. The autotransformer connection shown in FIG. 3 provides a way to achieve this low value of stray inductance. It is well known that other circuit constants being equal, leakage inductance of a transformer varies as the square of the turns ratio. See, Flanagan, 10.5 as an example. Assuming a stepup voltage requirement of approximately ten, an autotransformer would allow attainment of the same voltage with a turns ratio of nine, thus achieving a reduction in leakage inductance of 20%.

Pulse compression varies as the square root of the ratio of the maximum (unsaturated) inductance to switched inductance. Switched inductance, which is after the switch is closed, is made up of saturated core inductance plus transfer stray inductance, and for low values of inductance associated with nanosecond pulses of several thousands of volts the circuit stray inductance can constitute a large percentage of the transfer inductance and thus limit the minimum pulse width obtainable. Because of this in some cases in can be desirable to increase the input voltage. As one skilled in the art would recognize, a LC inversion circuit can provide this higher input voltage. For example U.S. Pat. No. 5,090,021, items 8, 19, 11 and 9 show an L-C inversion circuit.

FIG. 7 shows a two stage compressor circuit followed by a pulse transformer and laser peaking capacitors. Capacitor C1 is charged to a voltage from an external source. All other capacitors are discharged. For simplicity all capacitors, inductors, and conductors are considered ideal and lossless. Capacitors C1 and C2 are assumed to be the same value, and peaking capacitor C3 is assumed to be the same value divided by the square of the transformer turns ratio. A typical value for capacitors C1 and C2 is 0.25 uF. The low impedance level at which the external source must deliver current in order to supply the average power required for multikilohertz operation, plus the system requirement for pulse-to-pulse energy control, requires that a disconnect means must be provided prior to closure of switch S1. This disconnect means may be a switch with both opening and closing capability, or since total isolation is not required may take the form of an isolation element with high and low impedance states. For a more detailed explanation please refer to patent application Ser. No. 08/842,578 "Magnetic Switch Controlled Power Supply Isolator and Thyristor Commutating Circuit" which is incorporated herein by reference.

Two impedance states which differ by a minimum of ten to one are easily obtained and have been found to be adequate both for proper compressor circuit timing and power supply surge protection as well as isolation from the inverse voltage impressed on the compressor by the laser chamber discharge. S1 is closed, impressing initial voltage V across first compressor stage L1. The time constant of C1, C2, and the unsaturated inductance of L1, which may be on the order of 0.5–1.0 us, is long compared to the volt-second holdoff capacity of L1, hence L1 saturates and switches to the low inductance state before C2 acquires appreciable charge.

When L1 saturates C2 rings up, placing voltage across L2 which by the logic assumed for the first stage switches and places voltage across the primary of the pulse transformer in a time of the order of 100 ns. The pulse transformer operates in the linear mode, transferring the primary voltage increased by the turns ratio across C3, causing the laser chamber to discharge. For ease of reference it is noted that the portion of the pulser which corresponds to L2, as shown in FIG. 8, is shown in FIG. 1 as core 3 of the compressor stack which is positioned between chill plate #3 and chill plate #4. Similarly the portion of the pulser which corresponds to L1, as shown in FIG. 8, is shown in FIG. 1 as core 1 and core 2 of the compressor stack.

Thus, at each succeeding stage, pulse compression takes place as core volt-second capacity, which obeys the expression ET=NAB, is reduced. In this relationship a given core is seen to support a voltage E for a time T which is the product of turns N, cross-section area A, and flux capacity B. Parameters which decide the optimum number of compressor stages are discussed at length in the literature, for example Greenwood and Druckman references cited in the Description of Related Art section herein.

Not shown is a reset current circuit which may be required to establish proper initial flux conditions in the magnetic cores, as this is covered in numerous references, for an example refer to the article by Melville referred to above.

In FIG. 8 the pulse transformer has been connected as an autotransformer. Here the voltage developed across the primary adds to the voltage developed across the secondary, permitting a reduction in the number of cores and a resulting reduction in leakage inductance, enhancing performance of the circuit.

While in the above description of the circuit the system has been assumed lossless, in the real circuit losses are incurred in the magnetic cores, capacitors and conductors. One skilled in the art would appreciate that these losses have to be taken into account, when designing and fine tuning of the pulser to achieve optimized performance and to minimize residual energy in the compressor stages which can lead to oscillations and circuit instabilities. Compressor design, taking losses into account, has been described in detail by von Bergmann, H. M., Swart, P. H., "Thyristor-Driven Pulsers for Multikilowatt Average Power Lasers", IEE Proceedings -B, Vol 139, No. 2, March 1992.

An embodiment of the present invention offers great simplification in fabrication and installation of high average power, high repetition rate solid state pulsers. While oil has been the high voltage insulation and heat conduction medium of choice for 100 years, its use requires leakproof enclosures built to withstand not only the static weight of this medium in service but also the motion of this medium in shipping and handling. Oil filled enclosures invariably entail the use of some expansion handling capability such as bellows or bladders, and oil circulation requires the use of pumps or fans, plumbing, heat exchangers, and related components which greatly add to the complexity of the equipment. Opening of such an enclosure for service requires oil removal by pump or other means and always causes contamination of internal parts by airborne dust and moisture, both of which have been proven to cause great degradation of dielectric properties of the oil.

To compensate for this known effect, additional space and thermal capacity must be provided for in design in order to operate the oil at reduced stress level which adds still more size and weight to the assembly. In production line processes, the possibility of process contamination due to a leak cannot be overlooked. Freon used in the vapor phase mode is a proven effective means of achieving high power density, but again a leak causes a system shutdown. Gas must be used at several atmospheres pressure to be effective, requiring use of pressure vessel design, construction, and instrumentation, and again a leak causes a system shutdown. As one example of the economies to be achieved, an air-insulated pulser of 1 KHz capability can be expected to weigh one third as much as an oil-insulated equivalent due solely to the weight of the oil and associated pump and heat exchanger.

This invention offers the attainment of pulses into an excimer laser of a few tens of nanoseconds pulse width in the 30 kV range at repetition rates of several kilohertz and average power of several tens of kilowatts. This is accomplished with only water as a coolant and without use of oils, freons, or pressurized gases for dielectric or heat removal purposes. This is accomplished at material stress levels which promise MTBF (mean time between failure) of several thousand hours operation, corresponding to 20E9 pulses or more, without shutdown. Service and module replacement can be accomplished by one individual using basic hand tools. The sole medium used for cooling is water at supply main pressure, which can be made part of the laser cooling system.

An additional advantage of this invention over the description in U.S. Pat. No. 5,142,166 is in the means of reducing the stray inductance. The transfer stray inductance is the inductance introduced by the connection between the compressor portion of the pulser and the transformer portion of the pulser. The formula which gives the inductance of parallel conductors and the formula the formula which gives the inductance for coaxial conductors are well known. (For example see the Grover reference cited in the Description of Related Art herein, at pp. 39–42.) From these equations it can be shown that for the dimensions presented herein for a coaxial structure of the present design and the geometry and assumed dimensions from the U.S. Pat. No. 5,142,166 which infers parallel conductors, shows the present design provides approximately a tenfold reduction in transfer inductance.

For the transfer inductance required to successfully drive an excimer laser from a low voltage pulser, particularly the ArF and $F_2$ types, values on the order of 20 nH are required for successful circuit operation and this regime cannot be achieved with parallel conductors. The present invention avoids the necessity of converting from the discrete output wire construction of U.S. Pat. No. 5,142,166 FIGS. 2 and 3 to coaxial feed by adopting as our basic structure the coaxial array shown and described herein.

While the method and apparatus of the present invention has been described in terms of its presently preferred and alternate embodiments, those skilled in the art will recognize that the present invention may be practiced with modification and alteration within the spirit and scope of the appended claims. The specifications and drawings are, accordingly, to be regarded in an illustrative rather than a restrictive sense. Further, even though only certain embodiments have been described in detail, those having ordinary skill in the art will certainly understand that many modifications are possible without departing from the teachings thereof. All such modifications are intended to be encompassed within the following claims.

What is claimed is:

1. A pulser assembly for applying voltage pulses to an active medium of a pulsed laser, comprising:

a plurality of cores aligned to share a central axis;

a plurality of isolating members aligned with the central axis, wherein at least one of said plurality of isolating members is positioned between each one of the plurality of cores;

a plurality of first conducting members aligned with the central axis, wherein a fist conducting member is positioned between each one of the cores;

a plurality of second conducting members selectively coupling the first conducting members; and a solid dielectric material disposed along the central axis and between each one of the plurality of cores to provide galvanic isolation and thermal conductivity, said solid dielectric laser avoiding leakage associated with liquid and gaseous dielectrics.

2. The pulser assembly of claim 1 further comprising:
a capacitor coupled to one of the plurality of first conducting members;
wherein a first subset of the plurality of cores, and a first subset of the plurality of isolating members, and a first subset of the plurality of first conducting members, and a first subset of the plurality of second conducting members, operate in conjunction with the capacitor to provide a pulse compression portion of the pulser assembly which outputs a voltage pulse;
wherein a second subset of the plurality of cores, and second subset of the plurality of isolating members and a second subset of the plurality of first conducting members, and a second subset of the plurality of second conducting members provide a transformer portion of the pulser assembly which steps up the voltage of a voltage pulse output by the pulse compression portion of the pulser assembly.

3. The pulser assembly of claim 2 further comprising:
a coverplate, aligned with the central axis and disposed between the transformer portion of the pulser assembly and the pulse compression portion of the pulser assembly, wherein the coverplate is coupled to the transformer portion of the pulser assembly and to the pulse compression portion of the pulser assembly.

4. The pulser assembly of claim 3 further comprising a center rod disposed along the central axis and coupled to the coverplate.

5. The pulser assembly of claim 1, wherein said isolating members comprise ceramic material.

6. A pulser assembly for applying voltage pulses to an active medium of a pulsed laser, comprising:
a pulse compressor aligned along a central axis, wherein the pulser compressor has an output; and
a transformer aligned along the central axis, wherein the transformer is coupled to the output of the pulser compressor; and
a solid dielectric material disposed adjacent to the central axis, which provides galvanic isolation and thermal conduction, said solid dielectric avoiding leakage associated with liquid and gaseous dielectrics.

7. The pulser assembly of claim 6 wherein the pulse compressor includes:
a plurality of cores aligned with the central axis;
a plurality of conducting members aligned with the central axis wherein a conducting member is positioned on either side of each one of the plurality of cores; and
at least one capacitor arranged around an axis aligned with the central axis and coupled to one of the conducting members.

8. The pulser assembly of claim 6 further comprising a coverplate disposed between pulse compressor and the transformer, wherein the coverplate couples the pulse compressor to the transformer.

9. The pulser assembly of claim 6 wherein the pulse compressor includes:
a first plurality of cores;
a first plurality of isolating members, wherein an isolating member is disposed between each one of the first plurality of cores;
a first plurality of first conducting members, wherein a first conducting member is disposed between each of the first plurality of cores; and
a first plurality of second conducting members coupling the first plurality of first conducting members.

10. The pulser assembly of claim 9 wherein the transformer includes:
a second plurality of cores;
a second plurality of isolating members, wherein an isolating member of the second plurality of isolating members is disposed between each one of the second plurality of cores;
a second plurality of first conducting members, wherein a first conducting member of the second plurality of first conducting members is disposed between each of the second plurality of cores; and
a second plurality of second conducting members coupling the second plurality of first conducting members.

11. The pulser assembly of claim 10 wherein said each of the second plurality of cores has an inner edge defining an opening, and an outer edge defining a closed loop, such that said each of the second plurality of cores defines an open region about the central axis.

12. The pulser of claim 11 further comprising a center rod disposed along the central axis, and coupled to the coverplate.

13. The pulser of claim 11, wherein said inner and outer edges of said second plurality of cores are oval shaped.

14. A pulser assembly for applying voltage pulses to an active medium of a pulsed laser, comprising:
a pulse compressor having a central axis wherein the pulse compressor outputs voltage pulses;
a transformer aligned with the central axis;
a plurality of conducting members coaxially coupling the pulse compressor to the transformer;
wherein the transformer receives the voltage pulses output by the pulser compressor and steps up the voltage pulses so that the voltage pulses applied to the active medium produce output laser pulses at predetermined energies; and
a solid dielectric disposed along the central axis for providing galvanic isolation and thermal conductivity, said solid dielectric avoiding leakage associated with liquid and gaseous dielectrics.

15. The pulser assembly of claim 14 wherein the pulse compressor includes:
a first core, having a top and a bottom;
a first isolating member having a top and a bottom, wherein the bottom of the first isolating member is positioned adjacent to the top of the first core;
a second isolating member having a top and a bottom, wherein the top of the second isolating member is positioned adjacent to the bottom of the first core;
a first conducting board having a top and a bottom, wherein the bottom of the first conducting board is positioned adjacent to the top of the first isolating member;
a second conducting board having a top and a bottom, wherein the top of the second conducting board is positioned adjacent to the bottom of the second isolating member;
a third isolating member having a top and a bottom, wherein the top of the third isolating member is positioned adjacent to the bottom of the second conducting board;
a third conducting board having a top and a bottom, wherein the top of the third conducting board is positioned adjacent to the bottom of the third isolating member;

a fourth isolating member having a top and a bottom, wherein the top of the fourth isolating member is positioned adjacent to the bottom of the third conducting board;

a second core, having a top and a bottom, wherein the top of the second core is positioned adjacent to the bottom of the fourth isolating member;

a fifth isolating member having a top and a bottom, wherein the top of the fifth isolating member is positioned adjacent to the bottom of the second core;

a fourth conducting board having a top and a bottom, wherein the top of the fourth conducting board is positioned adjacent to the bottom of the fifth isolating member; and at least one capacitor coupled to the conducting boards, wherein conducting members of said plurality of conducting members couples said first, second, third, and fourth conducting boards.

16. The pulser assembly of claim 15 wherein said at least one capacitor is arranged around an axis aligned with the central axis.

17. The pulser assembly of any of claims 2, 5, 15 or 16, wherein said capacitor is a hoop style capacitor.

18. The pulser assembly of claim 14 wherein the pulse compressor includes a plurality of conducting boards having an inner diameter and an outer diameter, and wherein at least one of the plurality of conducting members couples at least two of the plurality of conducting boards at portions of the conducting boards which are adjacent to the inner diameter of the conducting boards, and at least one of the plurality of conducting members couples two of the conducting boards at portions of the boards which are adjacent to an outer diameter of the conducting boards.

19. A pulser for providing pulses of high voltage power to an active laser medium of a pulsed laser system, comprising:
    a pulse compressor, having an input and an output, wherein the pulse compressor includes: a first plurality of cores having a top and a bottom; a first plurality of conducting boards, wherein a conducting board is disposed adjacent to the top and bottom of each one of the first plurality of cores; a first plurality of conducting members coupling the first plurality of conducting boards such that the first plurality of conducting members and the first plurality of conducting boards form a plurality of equal width conducting loops around the first plurality of cores; and
    a pulse transformer coupled to an output of the pulse compressor, wherein the pulse transformer includes: a second plurality of cores having a top and a bottom, and a second plurality of conducting boards, wherein one of the second plurality of conducting plates is disposed adjacent to the top and bottom of each of the second plurality of cores, wherein a second plurality of conducting members are used to couple the second plurality of conducting boards such that the second plurality of conducting boards and the second plurality of conducting members form a plurality of equal width conducting loops around the second plurality of cores, such that the original voltage level of the output received by the pulse transformer from the pulse compressor is stepped up to a higher voltage level to energize the active medium of the laser system for producing output laser pulses at predetermined pulse energies.

20. The pulser of claim 19 wherein the first plurality of cores have an inner diameter and an outer diameter, and the first plurality of conducting boards have an inner and outer diameter.

21. The pulser of claim 20 further comprising a solid dielectric material disposed in an area within the inner diameter of the first plurality of cores and in an area within the inner diameter of the first plurality of conducting boards.

22. The pulser of claim 19, wherein the pulse compressor further includes a chill plate assembly, positioned between each one of the first plurality of cores to provide cooling to the first plurality of cores.

23. A pulser assembly for applying voltage pulses to an active medium of a pulsed laser, comprising:
    a pulse compressor for outputting compressed voltage pulses at an output, including:
        a plurality of cores aligned with a central axis;
        a plurality of conducting boards aligned with the central axis, wherein at least one of the plurality of conducting boards is positioned between each one of the plurality of cores;
        a plurality of outer conducting members arranged parallel to the central axis and positioned at a first distance from the central axis, wherein the plurality of outer conducting members couple the conducting boards;
        a plurality of inner conducting members parallel to the central axis and positioned at a second distance from the central axis, wherein the plurality of inner conducting members couple the conducting boards;
        a solid dielectric material disposed along the central axis and between each of the plurality of cores for providing galvanic isolation and thermal conductivity, said solid dielectric avoiding leakage associated with liquid and gaseous dielectrics; and
    a transformer coupled to the output of the pulse compressor for stepping up the voltage of the voltage pulses.

24. The pulser assembly of claim 23 further including a chill plate positioned between a first core of the plurality of cores and a second core of the plurality cores.

25. The pulser assembly of any of claims 14–21, 19, or 23, wherein said conducting members each comprise a bus bar.

26. A pulser assembly for applying voltage pulses to an active medium of a pulsed laser, comprising:
    a plurality of cores;
    a plurality of first conducting members aligned with the cores, wherein a conducting member is positioned between each one of the cores;
    a plurality of second conducting members selectively coupling the first conducting members; and
    a conformal dielectric material disposed between the cores, said conformal dielectric avoiding leakage associated with liquid and gaseous dielectrics.

27. The pulser assembly of claim 26 further including a chill plate positioned between a first core of the plurality of cores and a second core of the plurality of cores.

28. The pulser assembly of claim 26 further comprising:
    a capacitor coupled to one of the plurality of first conducting members;
    wherein a first subset of the plurality of cores, and a first subset of the plurality of isolating members, a first subset of the plurality of first conducting members, and a first subset of the plurality of second conducting members, operate in conjunction with the capacitor to provide a pulse compression portion of the pulser assembly which outputs a voltage pulse;
    wherein a second subset of the plurality of cores, and second subset of the plurality of isolating members and a second subset of the plurality of first conducting members, and a second subset of the plurality of second conducting members provide a transformer portion of the pulser assembly which steps up the voltage of a voltage pulse output by the pulse compression portion of the pulser assembly.

29. The pulser assembly of claim 28 further comprising a center rod disposed along a central axis and coupled to said one of said plurality of first conducting members.

30. The pulser assembly of claim 28 further comprising:
a coverplate, aligned with a central axis and disposed between the transformer portion of the pulser assembly and the pulse compression portion of the pulser assembly, wherein the coverplate is coupled to the transformer portion of the pulser assembly and to the pulse compression portion of the pulser assembly.

31. The pulser assembly of any of claims 9–10, 26 or 28, wherein said second conducting members each comprise a bus bar.

32. The pulser assembly of claim 26, wherein a first subset of the plurality of first conducting members are a printed circuit board having conducting material disposed thereon wherein a conducting material pattern is disposed on the printed circuit board such that a distance from the outer edge of the conducting material pattern to a center area of the conducting material pattern varies from a maximum distance to a minimum distance.

33. A pulser assembly for applying voltage pulses to an active medium of a pulsed laser, comprising:

a coaxial pulse compressor including a solid dielectric material which provides thermal conduction and galvanic isolation, said solid dielectric material avoiding leakage associated with liquid and gaseous dielectric materials;

a coaxial pulse transformer including a solid dielectric material which provides thermal condition galvanic isolation, coupled to the pulse compressor; and wherein the pulse compressor and pulse transformer operate to output voltage pulses in excess of 10 kilovolts at a frequency greater than 1 KHz.

34. The pulser assembly of claim 33 wherein the purser compressor includes a water cooled chill plate.

35. The pulser assembly of claim 33 wherein the pulse compressor includes:
a plurality of cores; and
wherein a chill plate is positioned between each one of the plurality of cores.

36. The pulser assembly of claim 33 wherein the pulse transformer includes a water cooled chill plate.

37. The pulser assembly of claim 33 wherein the pulse transformer includes:
a plurality of cores; and
wherein a chill plate is positioned between each one of the plurality of cores.

* * * * *